(12) United States Patent
Colgan et al.

(10) Patent No.: US 9,093,446 B2
(45) Date of Patent: Jul. 28, 2015

(54) CHIP STACK WITH ELECTRICALLY INSULATING WALLS

(71) Applicant: International Business Machines Corporation, Armonk, NY (US)

(72) Inventors: Evan G. Colgan, Chestnut Ridge, NY (US); Jae-Woong Nah, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 13/745,966

(22) Filed: Jan. 21, 2013

(65) Prior Publication Data
US 2014/0203428 A1    Jul. 24, 2014

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 25/00* | (2006.01) | |
| *H01L 23/00* | (2006.01) | |
| *H01L 25/07* | (2006.01) | |

(52) U.S. Cl.
CPC .......... *H01L 25/50* (2013.01); *H01L 24/03* (2013.01); *H01L 24/81* (2013.01); *H01L 25/074* (2013.01); *H01L 2224/16145* (2013.01); *H01L 2224/73253* (2013.01); *H01L 2924/16152* (2013.01)

(58) Field of Classification Search
CPC .......... H01L 2224/73253; H01L 2224/16; H01L 2924/16152; H01L 23/3107; H01L 23/4334

USPC .................. 257/734, 737, 738, 778, 780, 787
See application file for complete search history.

(56) References Cited

U.S. PATENT DOCUMENTS

| | | |
|---|---|---|
| 4,484,054 A | 11/1984 | Morino |
| 4,531,044 A | 7/1985 | Chang |
| H487 H | 7/1988 | Clark et al. |
| 4,937,934 A | 7/1990 | Devera et al. |
| 5,156,324 A | 10/1992 | Hueste et al. |
| 5,249,733 A | 10/1993 | Brady et al. |
| 5,338,971 A | 8/1994 | Casati et al. |
| 5,354,965 A | 10/1994 | Lee |
| 5,743,457 A | 4/1998 | Benedette et al. |
| 5,763,296 A | 6/1998 | Casati et al. |
| 5,768,109 A | 6/1998 | Gulick et al. |
| 6,078,502 A | 6/2000 | Rostoker et al. |
| 6,137,237 A | 10/2000 | MacLennan et al. |
| 6,139,972 A | 10/2000 | Trott et al. |
| 6,313,587 B1 | 11/2001 | MacLennan et al. |
| 6,486,499 B1 | 11/2002 | Krames et al. |
| 6,514,782 B1 | 2/2003 | Wierer, Jr. et al. |
| 6,521,914 B2 | 2/2003 | Krames et al. |
| 6,573,537 B1 | 6/2003 | Steigerwald et al. |
| 6,844,571 B2 | 1/2005 | Krames et al. |
| 6,885,035 B2 | 4/2005 | Bhat et al. |
| 6,903,376 B2 | 6/2005 | Shen et al. |
| 6,949,887 B2 | 9/2005 | Kirkpatrick et al. |
| 7,112,888 B2 * | 9/2006 | Kuramoto et al. ............ 257/780 |
| 7,146,083 B2 | 12/2006 | Carr |

(Continued)

*Primary Examiner* — Zandra Smith
*Assistant Examiner* — John M Parker
(74) *Attorney, Agent, or Firm* — Cantor Colburn LLP; Louis Percello

(57) ABSTRACT

A chip stack is provided and includes two or more chips, a solder joint operably disposed between adjacent ones of the two or more chips, the solder joint occupying about 25-30% or more of an area of the chip stack and insulating walls disposed on at least one of the two or more chips to separate the solder joint from an adjacent solder joint.

5 Claims, 4 Drawing Sheets

(56) References Cited

U.S. PATENT DOCUMENTS

| | | |
|---|---|---|
| 7,250,685 B2 | 7/2007 | Shim et al. |
| 7,414,318 B2 | 8/2008 | Shim et al. |
| 7,416,906 B2 | 8/2008 | Tasaki et al. |
| 7,563,112 B2 | 7/2009 | Honda |
| 7,638,812 B2 | 12/2009 | Tasaki et al. |
| 7,677,905 B2 | 3/2010 | Honda |
| 7,737,551 B2 | 6/2010 | Otremba |
| 7,751,924 B2 | 7/2010 | Chainer et al. |
| 7,757,932 B2 | 7/2010 | Schultz |
| 7,902,678 B2 * | 3/2011 | Ohuchi et al. ............... 257/778 |
| 7,990,711 B1 | 8/2011 | Andry et al. |
| 8,002,164 B2 | 8/2011 | Shultz |
| 8,061,578 B2 | 11/2011 | Hartnett et al. |
| 8,067,780 B2 | 11/2011 | Shieh et al. |
| 8,199,457 B1 | 6/2012 | Palandech et al. |
| 8,210,422 B2 | 7/2012 | Zadesky |
| 8,450,848 B2 * | 5/2013 | Sakurai ............... 257/738 |
| 2001/0017414 A1 * | 8/2001 | Gilleo ............... 257/737 |
| 2002/0014703 A1 * | 2/2002 | Capote et al. ............... 257/778 |
| 2003/0218261 A1 * | 11/2003 | Capote et al. ............... 257/787 |
| 2005/0218517 A1 * | 10/2005 | Capote et al. ............... 257/738 |
| 2006/0278997 A1 | 12/2006 | Gibson et al. |
| 2008/0157353 A1 * | 7/2008 | Watanabe et al. ............ 257/734 |
| 2009/0108446 A1 * | 4/2009 | Nagai ............... 257/737 |
| 2011/0169158 A1 * | 7/2011 | Varanasi ............... 257/692 |

* cited by examiner

CHIP STACK WITH ELECTRICALLY INSULATING WALLS

BACKGROUND

The present invention relates to chip stacks, and more specifically, to 3D chip stacks with electrically insulating walls between microbumps.

In 3D chip stacks, chips such as integrated circuits are layered on top of one another in a three-dimensional stack with electrical interconnects between layers. This configuration has many benefits, such as providing a designer with the ability to place an increased number of chips in a given two-dimensional area with an increased amount of electrical communications between them. Since there is no thermal expansion mismatch between silicon chips, finer pitch (</=100 microns) electrical interconnects, such as microbumps with a density of ten thousand or more connections per square centimeter, can be used. However, such 3D chip stacks are more difficult to adequately cool then a planar array of individual chips.

Recently, it has been seen that the thermal resistance of a microbump joining layer between chips in a 3D chip stack can limit allowable power distributions and stack heights. Moreover, in conventional flip-chip bonding, a size of a microbump area is limited to a given percentage of a total size of a fully populated array. This design rule is used to prevent a given microbump from "bridging" between adjacent pads. Thus, in an effort to prevent bridging, it is often necessary to limit a size of a microbumps area in a microbump array.

For example, in a conventional flip-chip bonding process a pick and place tool may be used to place the chip face down on a substrate where the chip contains solder balls on about 200 micron pitch, for example, controlled collapse chip connections (C4s), and the substrate contains matching pads, and the combination is then passed through a reflow furnace to join the chip to the substrate by melting the solder. The surface tension of the solder in the molten state serves to "self-align" the chip to the substrate, assuming that the solder balls are placed on the appropriate pads. To avoid having solder "bridging" between adjacent pads, or a C4 solder ball contact multiple pads on the substrate, the solder ball diameter usually does not exceed half of the pitch between solder pads. For a square array, this means that the solder area is limited to about 20% of the total joint area.

These limitations often lead to limits in the allowable power distributions and stack heights in 3D chip stacks due to the thermal resistance of the microbump joining layer(s).

SUMMARY

According to one embodiment of the present invention, a chip stack is provided and includes two or more chips, a solder joint operably disposed between adjacent ones of the two or more chips, the solder joint occupying about 30% or more of an area of the chip stack and insulating walls disposed on at least one of the two or more chips to separate the solder joint from an adjacent solder joint.

According to another embodiment, a chip stack element is provided. The chip stack element includes a substrate having two major surfaces, solder pads arrayed along a plane of one of the major surfaces and walls formed of electrically insulating material disposed between adjacent ones of the solder pads.

According to another embodiment, a system for forming chip stacks is provided and includes a chip stack element including a substrate having two major surfaces, solder pads arrayed along a plane of one of the major surfaces and walls formed of electrically insulating material disposed between adjacent ones of the solder pads and an adjacent chip stack element. The adjacent chip stack element includes a substrate having two major surfaces and microbumps arrayed along a plane of one of the major surfaces and is disposable relative to the chip stack element such that solder joint material of the microbumps aligns with the solder pads of the chip stack element.

According to another embodiment, a method of forming a chip stack is provided and includes arraying solder pads along a plane of a major surface of a substrate and forming walls of electrically insulating material between adjacent ones of the solder pads.

According to yet another embodiment, a method of forming a chip stack is provided and includes forming a chip stack element to include a substrate having two major surfaces, solder pads arrayed along a plane of one of the major surfaces and walls formed of electrically insulating material disposed between adjacent ones of the solder pads, forming an adjacent chip stack element to include a substrate having two major surfaces, pads of a conductive seed layer arrayed along a plane of one of the major surfaces, metallic posts disposed on top surfaces of the conductive seed layer pads and underbump metallurgy and solder joint material disposed on the metallic posts and disposing the adjacent chip stack element relative to the chip stack element such that the solder joint material aligns with the solder pads of the chip stack element.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

It is desirable to be able to significantly increase a fraction of solder area present between chips in a chip stack to reduce vertical thermal resistances between chips while also avoiding solder bridging between microbumps.

The description provided below relates to a 3D chip stack in which insulating guiding structures (i.e., "walls") are formed on one or both of the major chip surfaces. The walls will substantially reduce or prevent misalignment of solder joint material and block solder bridging between adjacent pads. This will lead to an ability to increase microbump areas, which will significantly reduce the vertical thermal resistances in the chip stack.

Figure 1:
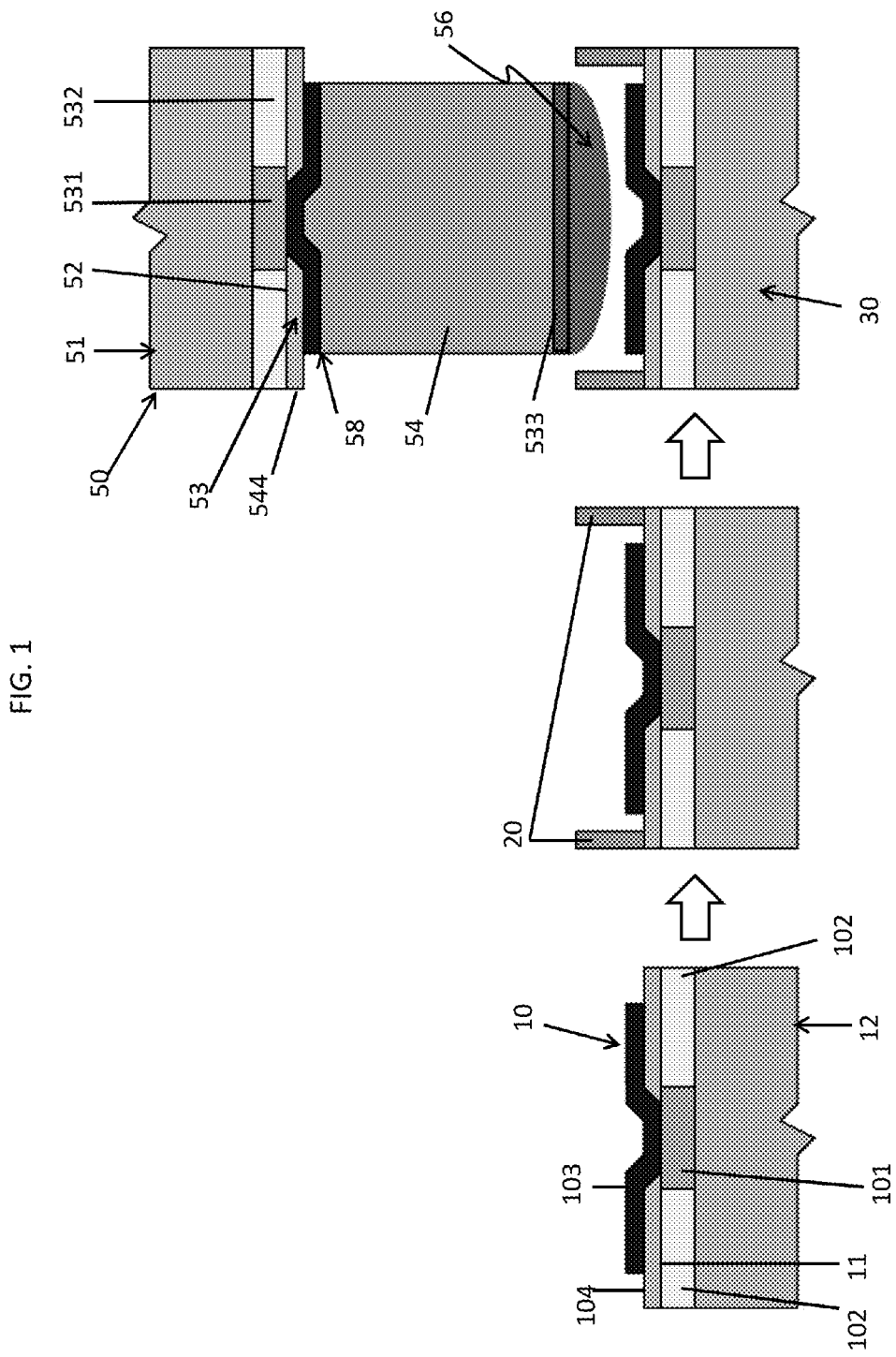
FIG. 1 is a schematic flow diagram illustrating a method of forming a chip stack element in accordance with embodiments.

With reference to FIG. 1, a method of forming a chip stack is provided. As shown in FIG. 1, the method initially includes arraying solder pads 10 along a plane of one of two major surfaces (i.e., a "top" surface") 11 of a substrate 12. The substrate 12 may be formed of silicon and includes active electronic devices along one major surface, thru silicon vias to provide electrical connections between the two major surfaces of the chip, multiple levels of wiring to interconnect the active electronic devices on the chip active face and capture pads or redistribution wiring on the inactive major face of the chip for connection to the thru silicon vias.

In FIG. 1, interconnect pad 101 is disposed in a top level of multiple wiring levels to which a microbump will be interconnected and first insulator 102 surrounds the conductive interconnect pad 101. The solder pad arraying process may be achieved by, for example, depositing one or more second insulator layers 104 and forming an opening in the second insulator layer 104 to expose wiring of the interconnect pad 101. The opening in second insulator layer 104 may be tapered to improve metal coverage of a conductive seed layer over the edge of the openings. A conductive pad 103 is formed by electroplating of ball limiting metallurgy (for, e.g., copper, nickel, and gold layers) pads in openings of a photoresist layer which expose a blanket conductive seed layer, which is followed by stripping the photoresist and etching the exposed blanket seed layer processes. The final conductive pad 103 incorporates the conductive seed layer along with the electroplated ball limiting metallurgy layers.

Thus, the solder pads 10 may have a conductive (e.g., copper, nickel and gold layers) pad 103 and one or more second insulator layers 104. The conductive pad 103 is generally planar but has a depression in a central portion thereof at which the conductive pad 103 contacts the interconnect pad 101.

The case described above is for an "active" microbump connection where an electrical connection is made. In some cases, the opening in second insulator layer 104 is omitted and a "dummy" microbump connection is made which does not provide an electrical connection, but does provide a mechanical connection and reduces the thermal resistance between chip layers.

Once the arraying of the solder pads 10 is completed, walls 20 are formed of electrically insulating material, such as polymer material (e.g., polyimide), between adjacent ones of the solder pads 10. For example, a photoimageable polyimide (PSPI) layer could be use to fabricate the walls 20. The walls 20 surround each of the solder pads 10 along a top surface of the second insulator 104 and may extend vertically upwardly from the top surface of the second insulator 104. In accordance with embodiments, the walls 20 may be respectively associated with each of the solder pads 10 and may be separate from one another or continuous. In the latter case, the continuous walls 20 may be formed as a hexagonal array such that each solder pad 10 is surrounded by a six-sided continuous wall 20 (see FIG. 2).

As shown in FIG. 1, the walls 20 may be separated from the conductive pads 103 of the solder pads 10 due to alignment or processing tolerances and to provide space for any "squeeze out" of solder, as will be described below. In accordance with embodiments, the walls 20 may be disposed slightly less than halfway between the corresponding solder pad 10 and an adjacent solder pad 10. Thus, the walls 20 of the adjacent solder pad 10 will have ample space and the walls 20 between adjacent solder pads are effectively merged into a single wall 20 of the desired final width (see FIG. 2).

With the walls 20 formed as described above to surround the solder pads 10, a top surface of a chip stack element 30 is formed. Next, a bottom mating surface of adjacent chip stack element 50 is described, which carries a microbump and solder material that attaches to the conductive pad 103 on the top surface of the chip stack element 30. A microbump join is formed by reflowing solder joint material 56 (to be described below), which is formed as part of the bottom surface of the adjacent chip stack element 50, to the solder pads 10 on the top surface of chip stack element 30 as solder joints 40. The bottom surface of the adjacent chip stack element 50 includes a substrate 51 having a top surface 52 (which is invertible with respect to the top surface 11, as shown in FIG. 1), microbumps 53 arrayed along a plane of one of two major surfaces (i.e., the "top surface) 52, which includes conductive seed layer 58, metallic posts 54, underbump metallurgy 533, solder joint material 56, and second insulator layer(s) 544.

The microbumps 53 may be formed by a somewhat similar method as described above with respect to the solder pads 10. If the material of the metallic posts 54 and the capture pad or redistribution wiring 531 (to be described below) are dissimilar and can react, the blanket conductive seed layer 58 can incorporate a barrier layer. Note that a similar barrier layer can be incorporated in the conductive seed layer used in fabrication of the conductive pad 103, if required. After the blanket conductive seed layer 58 is deposited, conductive metallic post 54, underbump metallurgy 533 and solder joint material 56 may be formed by electroplating through openings in a photo patterned layer such a spin coated resist or dry film resist, which is followed by stripping the resist and etching the conductive seed layer 58 to isolate the microbumps. Similar to the description above, the microbumps 53 may include the seed layer 58, the conductive metallic post 54 (e.g., copper), underbump metallurgy 533 (e.g. nickel), solder joint material 56, and second insulator layer(s) 544.

As described above for substrate 12, substrate 51 may be formed of silicon and may include active electronic devices along one major surface, thru silicon vias to provide electrical connections between the two major surfaces of the chip, multiple levels of wiring to interconnect the active electronic devices on the chip active face, and capture pads or redistribution wiring on the inactive major face of the chip for connection to the thru silicon vias.

In FIG. 1, the capture pad or redistribution wiring 531 is disposed on the inactive major surface of the chip on which a microbump will be formed and the first insulator 532 represents a first insulator, which surrounds the conductive pads. The seed layer 58 is generally planar but has a depression in a central portion thereof at which the seed layer 58 contacts the thru silicon via capture pad or redistribution wiring 531. The second insulator layer or layers 544 may be disposed around the depression of the seed layer 58 and between the planar portions of the seed layer 58 and the first insulator 532. The opening in the second insulator layer 544 may be tapered to improve metal coverage of the conductive seed layer 58 over the edge of the openings.

The case described above is for an "active" microbump connection where an electrical connection is made. In some cases, the opening in second insulator layer 544 is omitted and a "dummy" microbump connection is made, which does not provide an electrical connection, but does provide a mechanical connection and reduces the thermal resistance between chip layers. Note that in the above descriptions, the location of the conductive pad 103 on the active side of the chip and the location of the microbump 53 on the inactive side of the adjacent chip is the preferred configuration, but should not be considered limiting as alternate configurations are possible.

To join the top surface of adjacent chip stack element 30 to the bottom surface of the adjacent chip stack element 50, the adjacent chip stack element 50 is oriented as shown in FIG. 1 and disposed such that the solder joint material 56 of one of the microbumps 53 is proximate to the conductive pad 103 of a corresponding one of the solder pads 10. By way of, for example, pancake or intermetallic compound bonding (IMC), the solder joint material 56 is then heated or otherwise caused to reflow from the underbump metallurgy 533 to the conductive pad 103 of the corresponding one of the solder pads 10 whereby the walls 20 serve to insure that bridging of solder joint material 56 does not occur between adjacent solder pads 10 and underbump metallurgy 533. This could be done, for example, with a high precision flip-chip bonder, which provides a compressive force between the chip stack elements during the joining process.

Figure 2:
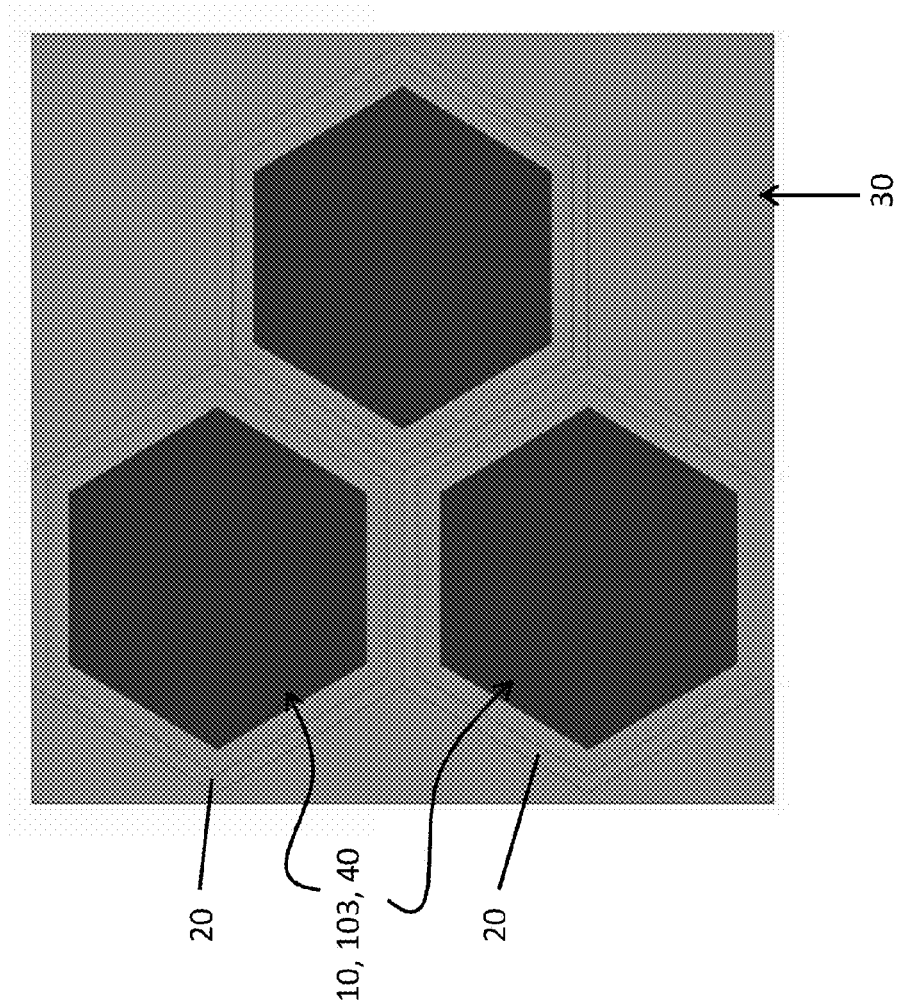
FIG. 2 is a plan view of the chip stack element formed by the method of FIG. 1.

A result of this processing can be seen in FIG. 2 in which the solder joints 40 are illustrated as being formed on the conductive pads 103 of the solder pads 10. As shown in FIG. 2, each pair of the solder pads 10 and the solder joints 40 are surrounded by the corresponding walls 20 in the exemplary hexagonal configuration.

The space defined between the walls 20 and the solder joints 40, which is visible in FIGS. 1 and 2 may be either be empty (as shown) or at least partially filled with solder joint material 56 that is prevented from bridging with another adjacent solder pad 10 or adjacent microbump 53 by a local portion of the walls 20.

In an embodiment of a six-sided continuous wall 20, the hexagonal pitch of adjacent conductive pads 103 and solder joints 40 may be approximately 50 μm with spacing between complementary sides of approximately 10 μm. In such cases, the width of the continuous walls 20 between complementary portions of adjacent conductive pads 103 and solder joints 40 may be approximately 4 μm thick such that the separation between the walls 20 and the conductive pads 103/solder joints 40 is approximately 3 μm thick. With such a configuration, the solder joints 40 occupy about 64% of the total area.

In the embodiment described above, a conventional underfill or pre-applied underfill (PAUF) can be used to encapsulate the resulting chip stack. The relative thickness of the copper post and solder layer can be varied to result in some solder remaining after bonding if a rework option is needed. With the above described intermetallic compound bonding or pancake bonding, rework may be difficult. The structure described is an exemplary configuration and should not be considered limiting.

Figure 3:
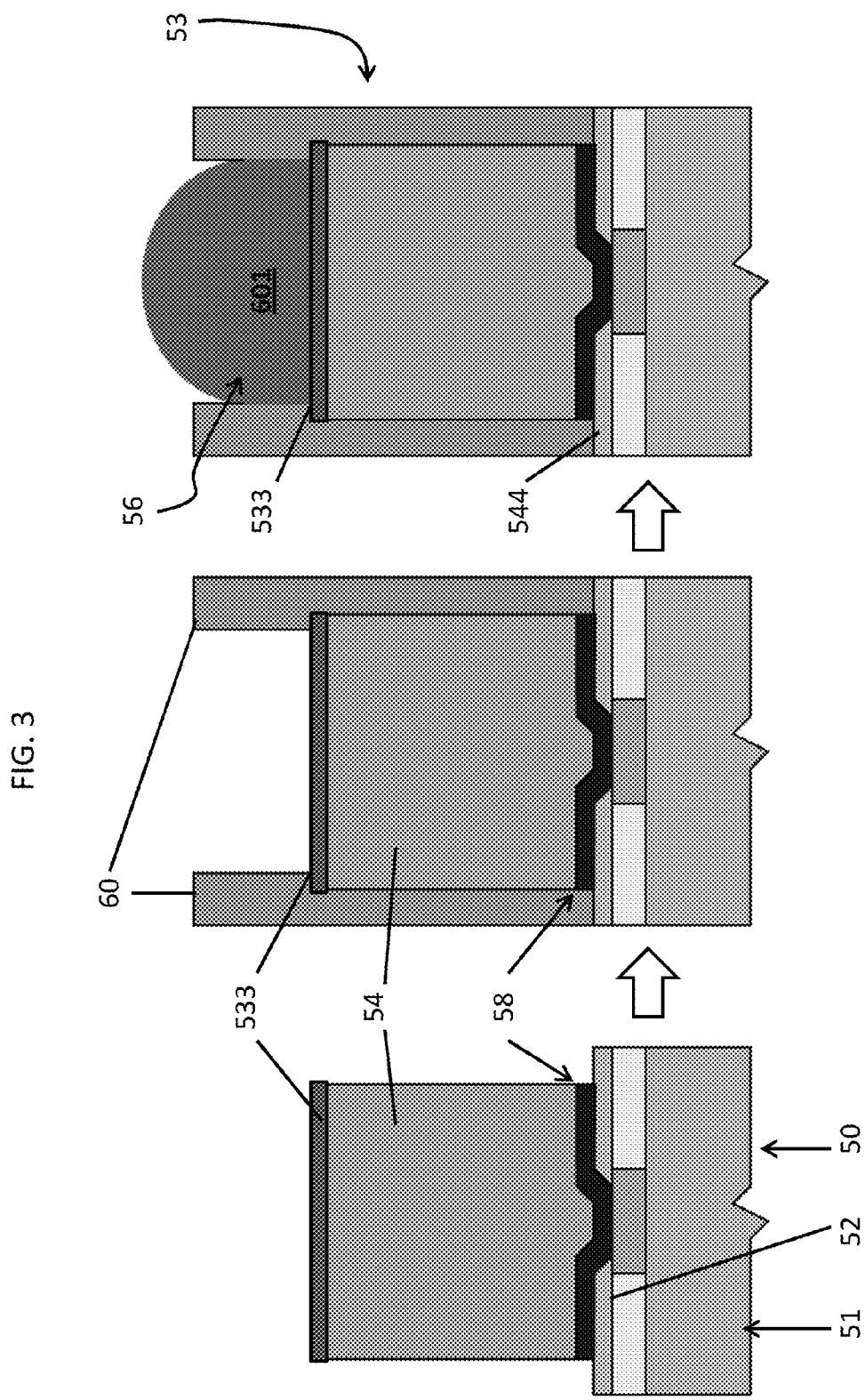
FIG. 3 is a schematic flow diagram illustrating an alternate method of forming a chip stack element in accordance with embodiments.

With reference to FIG. 3, an alternate embodiment is shown where the bottom surface of adjacent chip stack element 50 may further include walls 60. The walls 60 are similar to the walls 20 in that they may be formed of electrically insulating material, such as polymer material (e.g., polyimide), between adjacent ones of the seed layer 58, metallic posts 54, and underbump metallurgy 533. The walls 60 surround each of the seed layers 58, metallic posts 54, and underbump metallurgy 533 along the plane of the top surface 52 of the substrate 51 and may extend vertically upwardly from the second insulator 544. In accordance with embodiments, the walls 60 may be respectively associated with each of the microbumps 53 and separate from one another or continuous. In the latter case, the continuous walls 60 may be formed as a hexagonal array such that each microbump 53 is surrounded by a six-sided continuous wall 60.

As shown in FIG. 3, the metallic posts 54 and underbump metallurgy 533 may be wider than portions of the walls 60 and shorter than the walls 60 as measured from the top surface 52. Thus, the walls 60 and the metallic posts 54 and underbump metallurgy 533 delimit a recess 601 in which the solder joint material 56 may be contained. The structure shown in the middle image of FIG. 3 may be formed by means similar to that described above for FIG. 1 except that no solder joining layer is plated and the polyimide layer is thicker and fills between the underbump metallurgy 533 and metallic posts 54. The solder joining material may be added to the structure shown in FIG. 3 by using injection molded solder. This process would fill the cavity space 601 above the underbump metallurgy 533 and between the insulating walls 60 with liquid solder, which would then "ball-up" and extend above the insulating walls 60 after solidification as shown in FIG. 3.

In the structure described above, the underbump metallurgy 533 will need to be modified to not only contain a nickel layer, but also a gold layer to prevent oxidization of the nickel before the solder is injection molded. The structure described above and illustrated in FIG. 3 could be joined to the top surface of chip stack element 30 which does not contain polymer walls 20 as is illustrated in the left side of FIG. 1. In this second embodiment, a thin pre-applied underfill layer could be applied to either chip before bonding and as described above and the thickness of the solder layer can be varied as desired. The dimensions described above for the previous embodiment could again be used for the conductive post 54 but the area occupied by the solder joining material 56 would be somewhat less since the polymer walls 60 overlap the metallic posts 54 and underbump metallurgy 533 to form the recess 601.

Figure 4:
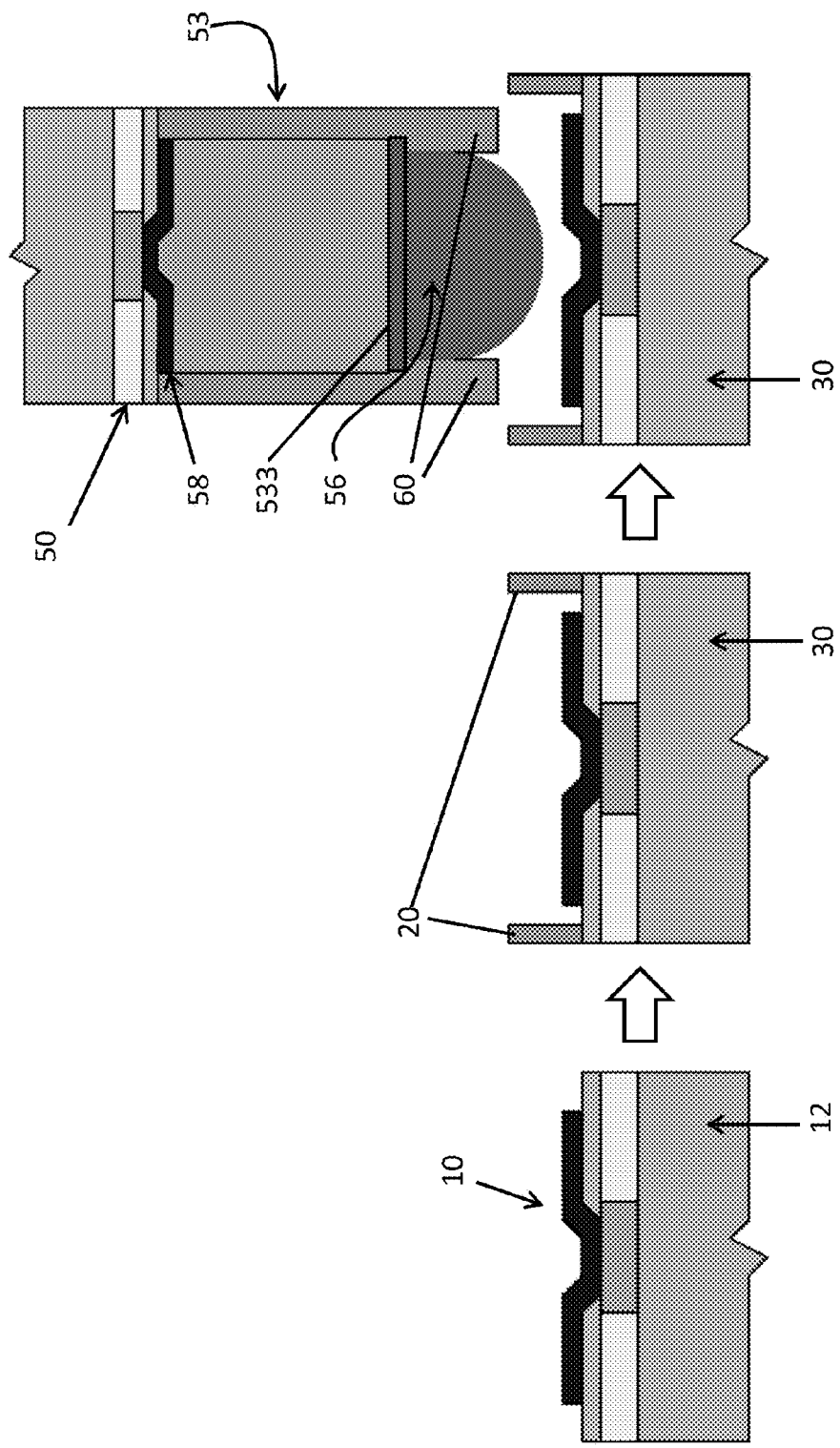
FIG. 4 is schematic a flow diagram illustrating a method of forming a chip stack in accordance with further embodiments.

In a third embodiment, a chip stack can be formed where polymer walls are present on both mating surfaces. With reference to FIG. 4, the bottom surface of adjacent chip stack element 50 of FIG. 3 may be joined to the conductive pad 103 of the corresponding one of the solder pads 10. As shown in FIG. 4, the walls 60 of the bottom surface of adjacent chip stack element 50 may be narrower than the walls 20 of the upper surface of chip stack element 30. In this way, when the bottom surface of adjacent chip stack element 50 is positioned, the walls 20 of the upper surface of chip stack element 30 and the walls 60 of the bottom surface of adjacent chip stack element 50 may be used to guide the solder joint material 56 reflow and to prevent bridging between adjacent solder pads 10. Note that in this embodiment, the polymer walls 60 surrounding each microbump 53 on the bottom surface of adjacent chip stack element 50 would need to be modified to contain channels into which the polymer walls 20 of the upper surface of chip stack element 30 could pass when they are joined.

In accordance with embodiments, a fraction of an area occupied by the solder pads 10 and microbumps 53, which are joined to form solder joints 40 in a chip stack, as described above, is increased relative to the conventional flip-chip packages or chip stacks. Thus, for a fully populated array, the solder pads 10 and microbumps 53 and corresponding solder joints 40 may have more than 25-30% connection areas, more than 50% connection areas or, more particularly, 50-60% connection areas. This added connection area may lead to, for example, reduced vertical thermal resistance in the chip stack.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A system for forming chip stacks, comprising:
   a chip stack element, comprising a substrate having two major surfaces, solder pads arrayed along a plane of one of the major surfaces with outer surfaces thereof disposed outwardly from a conductor and above insulators and walls formed of electrically insulating material disposed between adjacent ones of the solder pads; and
   an adjacent chip stack element, comprising a substrate having two major surfaces and microbumps arrayed along a plane of one of the major surfaces with outer surfaces thereof disposed outwardly from a conductor and above insulators,
   the adjacent chip stack element being disposable relative to the chip stack element such that solder joint material of the microbumps aligns with the solder pads of the chip stack element,
   the adjacent chip stack element further comprising walls formed of electrically insulating material disposed between adjacent ones of the microbumps, top edge portions of the walls of the adjacent chip stack element being narrower than top edge portions of the walls of the chip stack element,
   the walls of the chip stack element extending from uppermost surfaces of the insulators and being displaced from each of the adjacent ones of the solder pads, and
   the walls of the adjacent chip stack element extending from uppermost surfaces of the insulators and contacting each of the adjacent ones of the microbumps.

2. The system according to claim 1, wherein the walls of the chip stack element and the adjacent chip stack element comprise polymer.

3. The system according to claim 1, wherein the solder pads occupy more than about 25-30% of an area of the one major surface.

4. The system according to claim 1, wherein the solder pads occupy more than about 50% of an area of the one major surface.

5. The system according to claim 1, wherein the solder pads have a pitch of about 100 microns or less.

\* \* \* \* \*